United States Patent
Osorio Oliveros

(10) Patent No.: US 9,599,912 B2
(45) Date of Patent: Mar. 21, 2017

(54) LITHOGRAPHIC APPARATUS

(71) Applicant: ASML Netherlands B.V., Veldhoven (NL)

(72) Inventor: Edgar Alberto Osorio Oliveros, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 115 days.

(21) Appl. No.: 14/401,797

(22) PCT Filed: May 8, 2013

(86) PCT No.: PCT/EP2013/059617
§ 371 (c)(1),
(2) Date: Nov. 17, 2014

(87) PCT Pub. No.: WO2013/174656
PCT Pub. Date: Nov. 28, 2013

(65) Prior Publication Data
US 2015/0160569 A1    Jun. 11, 2015

Related U.S. Application Data

(60) Provisional application No. 61/649,901, filed on May 21, 2012, provisional application No. 61/681,435, filed on Aug. 9, 2012.

(51) Int. Cl.
*G03F 1/24* (2012.01)
*G03F 7/20* (2006.01)
(Continued)

(52) U.S. Cl.
CPC .......... *G03F 7/70916* (2013.01); *B82Y 10/00* (2013.01); *G02B 5/085* (2013.01); *G02B 5/0891* (2013.01); *G02B 27/0006* (2013.01); *G03F 1/24* (2013.01); *G03F 1/62* (2013.01); *G03F 7/7015* (2013.01); *G03F 7/70958* (2013.01); *G21K 1/062* (2013.01); *B82Y 30/00* (2013.01); *G21K 2201/067* (2013.01); *Y10S 977/734* (2013.01)

(58) Field of Classification Search
CPC ........................................................ G03F 1/24
See application file for complete search history.

(56) References Cited

U.S. PATENT DOCUMENTS

2007/0284557 A1    12/2007    Gruner et al.
2013/0188245 A1*    7/2013    Jaiswal ............... G02B 5/208
                                                                 359/350

FOREIGN PATENT DOCUMENTS

EP        1 416 329        5/2004
JP        2001-272769    10/2001
(Continued)

OTHER PUBLICATIONS

International Search Report and Written Opinion mailed Dec. 5, 2013 for corresponding International Patent Application No. PCT/EP2013/059617 (18 pages).

(Continued)

*Primary Examiner* — Stephen Rosasco
(74) *Attorney, Agent, or Firm* — Pillsbury Winthrop Shaw Pittman LLP

(57) ABSTRACT

A reflector includes a reflecting surface or structure provided with a cap layer formed from Silicene or a Silicene derivative. The reflector may be provided in a lithographic apparatus.

13 Claims, 7 Drawing Sheets

(51) Int. Cl.
*G21K 1/06* (2006.01)
*B82Y 10/00* (2011.01)
*G03F 1/62* (2012.01)
*G02B 5/08* (2006.01)
*G02B 27/00* (2006.01)
*B82Y 30/00* (2011.01)

(56) References Cited

FOREIGN PATENT DOCUMENTS

| JP | 2003-140356 | 5/2003 |
|---|---|---|
| JP | 2005-24827 | 1/2005 |

OTHER PUBLICATIONS

J.A. Mendez et al., "Preservation of far-UV aluminum reflectance by means of overcoating with C60 films", Applied Optics, vol. 39, No. 1, Jan. 1, 2000, pp. 149-156.

P. De Padova et al., "Strong resistance of silicene nanoribbons towards oxidation", Journal of Physics D: Applied Physics, vol. 44, No. 31, Jul. 14, 2011 (9 pages).

A. Kara et al., "A review on silicene—New candidate for electronics", Surface Science Reports, vol. 67, No. 1, Oct. 10, 2011, pp. 1-18.

B. Lalmi et al., "Epitaxial growth of a silicene sheet", Applied Physics Letters, vol. 97, No. 22, Dec. 2, 2010, pp. 223109-1-223109-2.

B. R. Burg et al., "Dielectrophoretic integration of single- and few-layer graphenes", Journal of Applied Physics, vol. 107, No. 3, Feb. 1, 2010, pp. 34302-1-34302-6.

\* cited by examiner

LITHOGRAPHIC APPARATUS

CROSS-REFERENCE TO RELATED APPLICATIONS

This application is the U.S. national phase entry of International Patent Application No. PCT/EP2013/059617, which was filed on 8 May 2013, which claims the benefit of U.S. provisional application 61/649,901, which was filed on 21 May 2012, and U.S. provisional application 61/681,435, which was filed on 9 Aug. 2012, and which are incorporated herein in their entireties by reference.

FIELD

The present invention relates to a lithographic apparatus and to components which may form part of a lithographic apparatus (or some other apparatus).

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

In an alternative arrangement a radiation system for producing EUV radiation may use an electrical discharge to generate the plasma. The electrical discharge passes into a gas or vapor such as Xe gas, Li vapor or Sn vapor, generating a very hot plasma which emits EUV radiation. Such a radiation system is typically termed a discharge produced plasma (DPP) source.

Plasma creation within an EUV source may cause contamination particles to be created from the fuel. Contamination within an EUV lithographic apparatus may adhere for instance to optical surfaces such as mirrors of the apparatus, or to the patterning device of the lithographic apparatus. The contamination may reduce the efficiency with which EUV radiation is reflected by the mirrors and/or may reduce the accuracy with which a pattern is projected by the EUV lithographic apparatus onto a substrate. The contamination of the optical surfaces or of the patterning device may require them to be replaced, which can be expensive and therefore any reduction in the replacement frequency may be advantageous. Furthermore, replacement of such parts of the lithographic apparatus or the EUV source is a time consuming process, during which the operation of the lithographic apparatus may have to be stopped. Stopping the operation of the lithographic apparatus may reduce the output of the lithographic apparatus and thereby reduce its efficiency, which is undesirable.

SUMMARY

It may be desirable to form a component of a lithographic apparatus (or some other apparatus) in a manner which is not known from the prior art.

According to a first aspect of the invention, there is provided a reflector comprising a reflecting surface or structure provided with a layer comprising a substance selected from Silicene, or a Silicene derivative, or fullerene, or a fullerene derivative, or combinations thereof. The layer may be a cap layer. The layer may be formed from Silicene or a Silicene derivative.

The reflecting structure may be a multilayer stack.

The reflecting surface may be a metal.

The cap layer may be a single layer of Silicene or a Silicene derivative. The cap layer may be a single layer of fullerene or a fullerene derivative.

The Silicene cap layer may comprise multiple layers of Silicene or a Silicene derivative, or flakes of Silicene or a Silicene derivative, or fullerene or fullerene derivatives.

According to a second aspect of the invention there is provided a pellicle comprising a substance selected from Silicene, or a Silicene derivative, or fullerene, or a fullerene derivative, or combinations thereof. The pellicle may be held by a supporting structure, or it may comprise multiple layers of Silicene or a Silicene derivative, or fullerene, or fullerene derivative, or flakes thereof.

The Silicene or Silicene derivative may comprise a plurality of layers or flakes of Silicene. The fullerene or fullerene derivatives may comprise a plurality of layers or flakes of fullerene.

The supporting structure may be a frame.

According to a third aspect of the invention there is provided a membrane comprising a substance selected from Silicene, or a Silicene derivative, or fullerene, or a fullerene derivative, or combinations thereof, held by a supporting structure.

According to a fourth aspect of the invention there is provided a spectral purity filter comprising a substance selected from Silicene, or a Silicene derivative, or fullerene, or a fullerene derivative, or combinations thereof. The spectral purity filter may be held by a supporting structure.

According to a fifth aspect of the invention there is provided a reflector comprising a reflecting surface or structure comprising a substance selected from Silicene, or a Silicene derivative, or fullerene, or a fullerene derivative, or combinations thereof.

According to a sixth aspect of the invention there is provided an apparatus comprising one or more of: the reflector of the first aspect, or the pellicle of the second aspect, or the membrane of the third aspect, or the spectral purity filter of the fourth aspect, or the reflector of the fifth aspect. The apparatus may be a lithographic apparatus, a source of EUV radiation, an inspection apparatus for lithographic components or other apparatus.

The lithographic apparatus of the sixth aspect may further comprise an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

According to a seventh aspect of the invention there is provided a method of applying a cap layer to a reflector comprising forming a layer of a substance selected from Silicene, or a Silicene derivative, or fullerene, or a fullerene derivative, or combinations thereof on a material, pressing the layer of Silicene or Silicene derivative onto a surface of the reflector, then etching away the material such that it forms a cap layer on the reflector.

According to an eighth aspect of the invention there is provided a method of making a membrane comprising a substance selected from Silicene, or a Silicene derivative, or fullerene, or a fullerene derivative, or combinations thereof, the method comprising forming a layer of said substance on a material, forming another layer of said substance on a further material, pressing the layers of Silicene together, then attaching the pressed together layers of Silicene or Silicene derivative to a support structure.

One or more additional layers comprising a substance selected from Silicene, or a Silicene derivative, or fullerene, or a fullerene derivative, or combinations thereof, may be pressed onto the layers before the pressed together layers are attached to the support structure.

According to a ninth aspect of the invention there is provided a method of applying a cap layer to a reflector comprising forming flakes of a substance selected from Silicene, or a Silicene derivative, or fullerene, or a fullerene derivative, or combinations thereof, in a solution, placing the reflector in the solution and attracting the flakes to the reflector to form the cap layer on the reflector.

According to a tenth aspect of the invention there is provided a lithographic apparatus comprising a radiation source configured to produce a radiation beam, a support configured to support a patterning device, the patterning device being configured to impart the radiation beam with a pattern to form a patterned radiation beam, a chamber located between the radiation source and the support, the chamber containing at least one optical component configured to reflect the radiation beam, the chamber being configured to permit radiation from the radiation source to pass therethrough, a membrane that defines part of the chamber, the membrane comprising a substance selected from Silicene, or a Silicene derivative, or fullerene, or a fullerene derivative, or combinations thereof, and being configured to permit the passage of the radiation beam through the membrane, and to prevent the passage of contamination particles through the membrane, and a particle trapping structure configured to permit gas to flow along an indirect path from inside the chamber to outside the chamber, the indirect path of the particle trapping structure being configured to substantially prevent the passage of contamination particles from inside the chamber to outside the chamber.

The membrane and particle trapping structure may be part of a source collector module or an illumination system of the lithographic device.

According to an eleventh aspect of the invention there is provided a lithographic apparatus comprising a radiation source configured to produce a radiation beam and a support configured to support a patterning device, the patterning device being configured to impart the radiation beam with a pattern to form a patterned radiation beam; wherein the support is provided with a pellicle which comprises a substance selected from Silicene, or a Silicene derivative, or fullerene, or a fullerene derivative, or combinations thereof.

According to a twelfth aspect of the invention there is provided a multilayer mirror comprising alternating layers of a first material and a second material, wherein a layer comprising a substance selected from Silicene, or a Silicene derivative, or fullerene, or a fullerene derivative, or combinations thereof, is provided between the alternating layers.

According to a thirteenth aspect of the invention there is provided a spectral purity filter comprising a grid configured to prevent or reduce the passage of infrared radiation, wherein the grid is covered with a substance selected from Silicene, or a Silicene derivative, or fullerene, or a fullerene derivative, or combinations thereof, which prevents the passage of oxygen to the grid.

According to a fourteenth aspect of the invention there is provided a lithographic mask comprising a patterned reflective surface or structure provided with a layer a substance selected from Silicene, or a Silicene derivative, or fullerene, or a fullerene derivative, or combinations thereof.

According to a fifteenth aspect of the invention there is provided a pellicle comprising a substance selected from Silicene, or a Silicene derivative, or fullerene, or a fullerene derivative, or combinations thereof.

The pellicle may further comprise one or more layers of supporting material.

The pellicle may further comprise a supporting structure which supports one or more layers of the pellicle.

According to a sixteenth aspect of the invention there is provided a reflector provided with a reflecting surface or structure comprising a layer of fullerene.

The reflector may comprise a multilayer stack.

According to a seventeenth aspect of the invention there is provided a spectral purity filter comprising a layer of fullerene, or a fullerene derivative, or silicene, or a silicene derivative, or combinations thereof. The spectral purity filter may comprise a first filter which blocks or reduces the intensity of radiation at a first wavelength and a second filter which blocks or reduces the intensity of radiation at a second wavelength, wherein the second filter comprises a layer of fullerene, or a fullerene derivative, or silicene, or a silicene derivative, or combinations thereof.

The first wavelength may be an infrared wavelength and the second wavelength may be a DUV wavelength.

According to an eighteenth aspect of the invention there is provided an apparatus comprising one or more of: the support to hold a lithographic mask of the fourteenth aspect, or the pellicle of the fifteenth aspect, or the reflector of the sixteenth aspect, or the spectral purity filter of the seventeenth aspect.

According to a nineteenth aspect of the invention there is provided a method of removing contamination from a mask which includes a layer of silicene, or a silicene derivative, or fullerene, or a fullerene derivative, or combinations thereof, to which contamination particles may become attached, the method comprising using an etching substance to destroy at least some of the layer such that the contamination particles are released from the layer.

The method may further comprise replacing or repairing the layer of silicene, or a silicene derivative, or fullerene, or a fullerene derivative, or combinations thereof, on the mask.

Any of the aspects of the invention may incorporate one or more suitable features of any other aspect of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
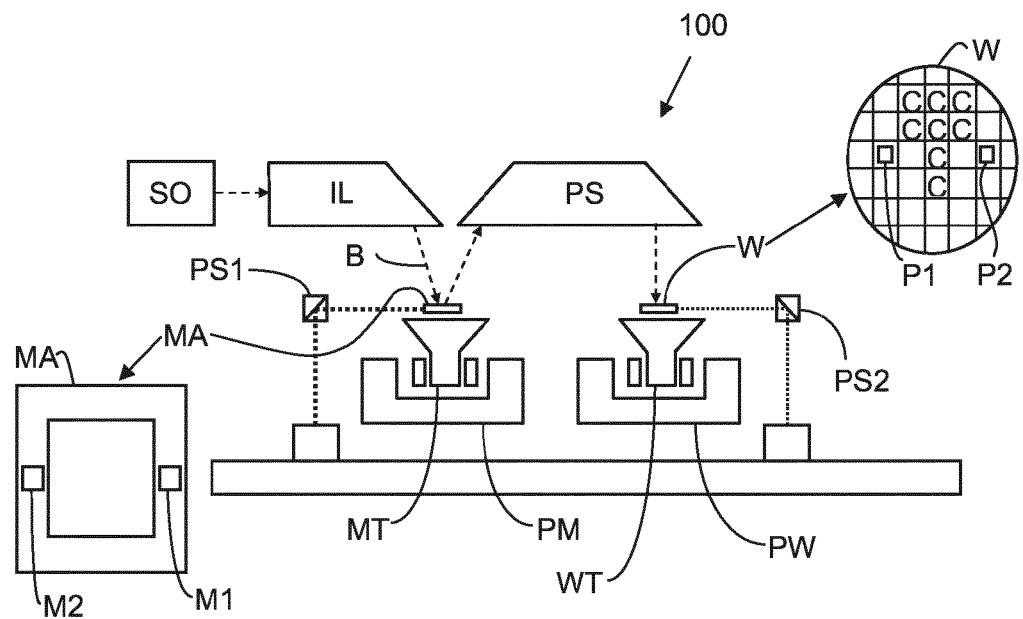
FIG. 1 depicts a lithographic apparatus according to an embodiment of the invention.

FIG. 1 schematically depicts a lithographic apparatus 100 including a source collector apparatus SO, according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
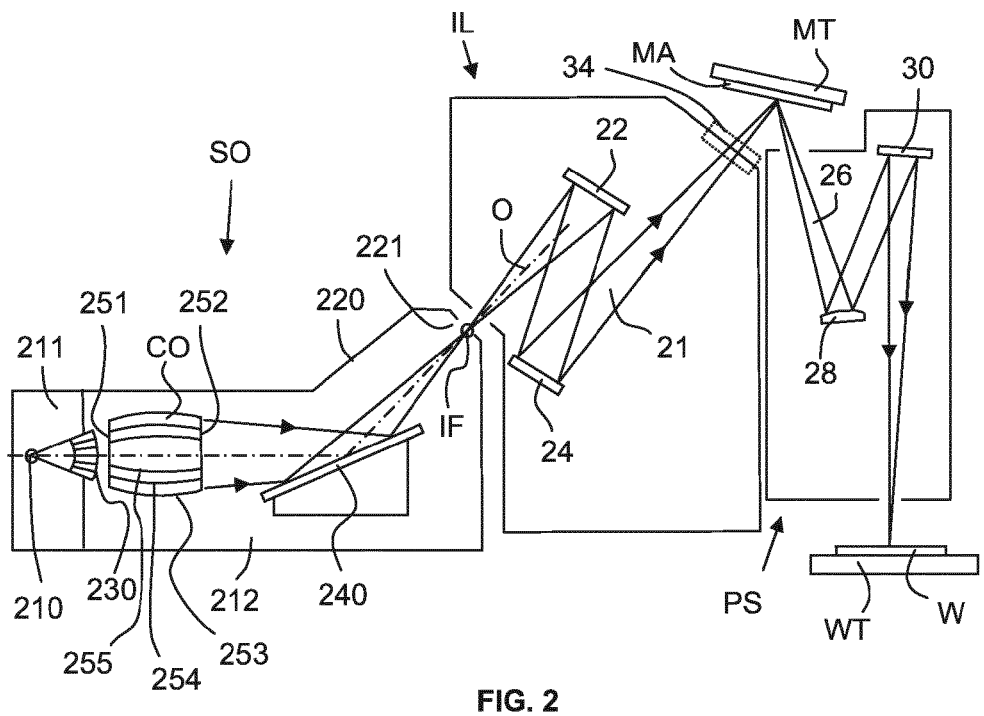
FIG. 2 is a more detailed view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 253. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253-255, just as an example of a collector (or collector mirror). The grazing incidence reflectors 253-255 are disposed axially symmetric around an optical axis O and a collector optic CO of this type is preferably used in combination with a discharge produced plasma source, often called a DPP source.

Figure 3:
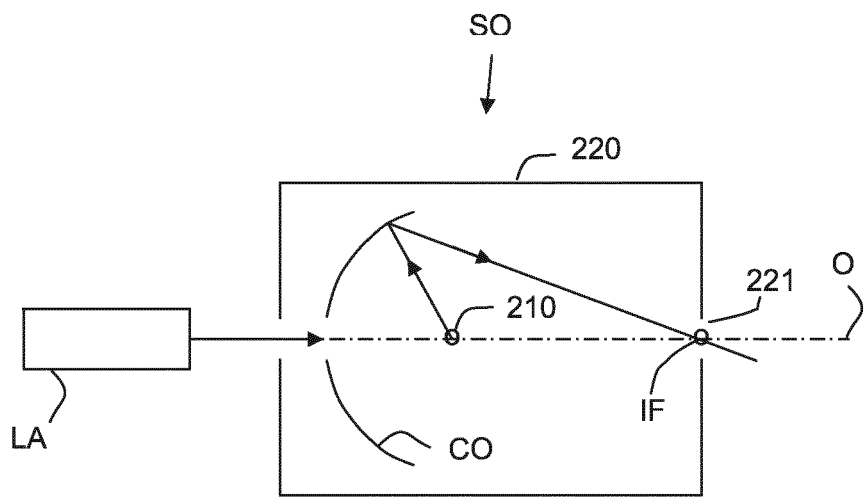
FIG. 3 is a more detailed view of the source collector apparatus SO of the apparatus of FIGS. 1 and 2.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
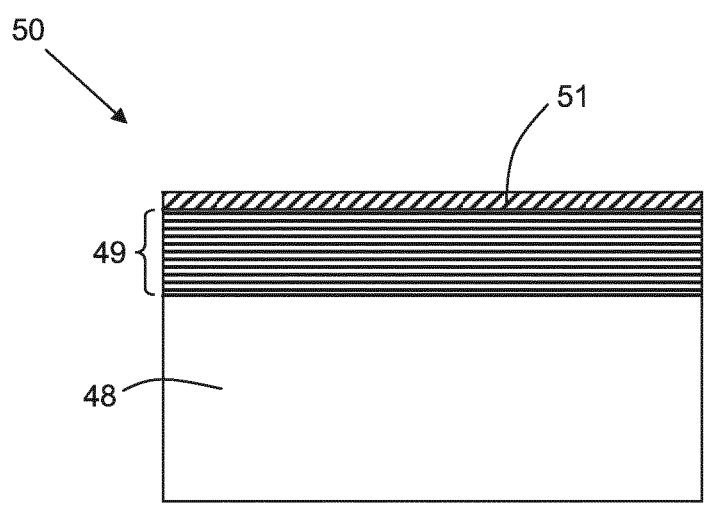
FIG. 4 is a schematic illustration of a mirror according to an embodiment of the invention.

FIG. 4 schematically shows viewed in cross-section a mirror 50 according to an embodiment of the invention which is configured to reflect EUV radiation. The mirror 50 may for example be one of the mirrors 22, 24, 28, 30 of the EUV lithographic apparatus as shown in FIG. 2. The mirror 50 comprises a multilayer stack 49 comprising alternating layers of Molybdenum and Silicon, the multilayer stack 49 being provided on a substrate 48 (e.g. quartz). The combination of the thicknesses of the Molybdenum and Silicon layers and their refractive indices is such that they cause EUV which is incident upon the mirror 50 to be reflected (reflection of radiation using multilayer stacks is well known in the art). Silicene layer 51 is provided as a layer on top of the multilayer stack 49. The Silicene layer 51 acts in this case as a cap layer which protects the multilayer stack 49. The Silicene layer 51 may be provided as a single or as multiple layers. By multiple layers herein is meant a plurality of single layers stacked on top of each other, wherein at least one of the layers comprises Silicene. Therefore, a multilayer Silicene may be fully formed by Silicene single layers, or it may be formed by Silicene single layers alternating with layers of other materials, or it may even be formed by randomly positioned Silicene layer(s) in a stack of other layers. The multiple layers may also comprise one or more layers formed with Silicene flakes overlapping to form a heterogeneous layer.

The Silicene single layer is a 1-atom thick sheet (i.e. a monolayer) of Silicon atoms arranged in a honeycomb structure. An explanation of the structure of Silicene may be found in Kara, Abdelkader et al, Surface Science Reports 67 (2012) 1-18, which is herein incorporated by reference.

Figure 5:
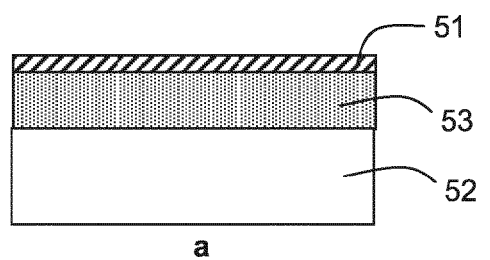
FIG. 5 is a schematic illustration of a diffraction grating according to an embodiment of the invention.
Figure 5:
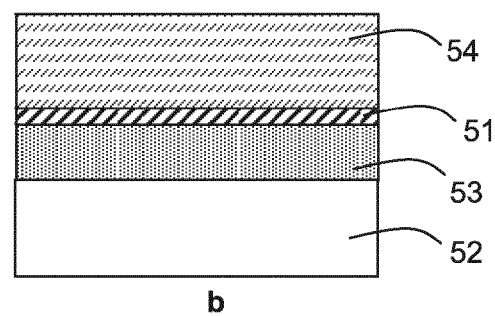
Figure 5:
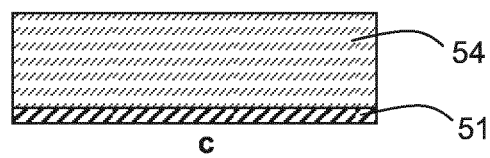
Figure 5:
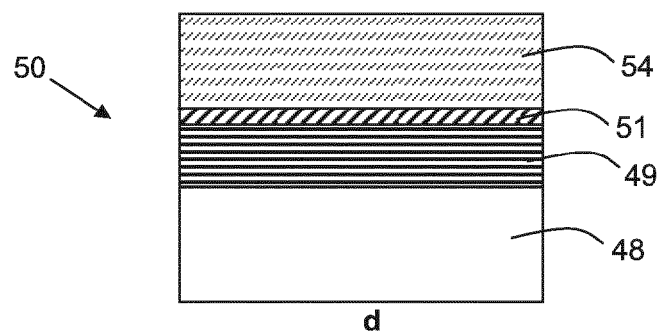
Figure 5:
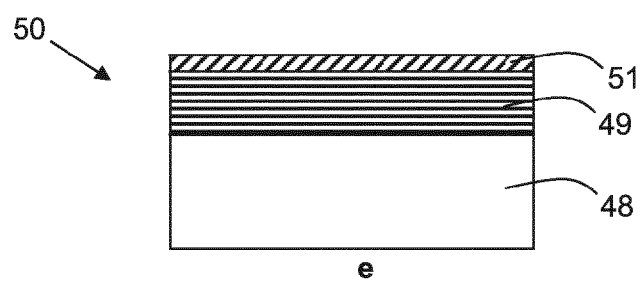

FIG. 5 represents schematically a process via which a layer of Silicene may be provided on a multilayer mirror comprising a multilayer stack 49.

Referring to FIG. 5a, a layer of Silicene 51 is formed on a single-crystal silver layer 53 which is supported by a substrate 52 (e.g. formed from silicon). The layer of Silicene is formed on an Ag(111) surface through epitaxial growth using direct condensation of a Silicon atomic flux in an ultra high vacuum. Direct heating of a piece of Si wafer is used to generate the Silicon atomic flux. The Ag(111) surface is held at a temperature between 220° C. and 250° C. during evaporation of the Silicon onto the Ag(111) surface. The rate of deposition of the Silicon onto the Ag(111) surface is less than 0.1 monolayers per minute. Only enough Silicon to produce a monolayer is evaporated onto the Ag(111) surface. This method of generating the Silicene layer is described in Boubekeur, Lalmi et al. Applied Physics Letters 97, 223109 (2010), which is herein incorporated by reference).

Referring to FIG. 5b, a layer of Poly-methyl Methacrylate (PMMA) 54 is formed on top of the Silicene layer. The PMMA 54 is provided over the Silicene layer 51 when the PMMA is above its glass transition temperature, and is then allowed to cool and solidify on top of the Silicene layer 51. The PMMA 54 may for example be spin coated onto the Silicene layer 51. A block of PMMA 54 is thus formed which adheres to the Silicene layer 51. In an embodiment, a baking step may be used in order to harden the PMMA layer 54.

Referring to FIG. 5c, the silver is etched away. This may be done using a wet chemical etching process, for example using nitric acid, or using mixtures of an iron-based oxidant and an inorganic acid such as phosphoric acid. The silver is thus removed, leaving behind the Silicene layer 51 attached to the PMMA block 54.

Referring to FIG. 5d, a multilayer mirror 50 comprising a multilayer stack 49 provided on a substrate 48 (e.g. quartz) is positioned beneath the Silicene layer 51 and PMMA block 54. These are then pressed together such that a good contact is established between the Silicene layer 51 and the top of the multilayer stack 49.

Referring to FIG. 5e, the PMMA is then removed, for example by using a plasma etch or using a solvent such as acetone. This exposes the Silicene layer 51. The Silicene layer 51 thus forms a cap layer on the multilayer mirror 50.

The materials referred to above are merely examples, and other suitable materials may be used. For example, the Silicene layer 51 may be provided on a layer of ZrBr2 instead of it being provided on a layer of single-crystal silver. The Silicene may be grown as an epitaxial honeycomb layer via surface segregation on ZrBr2. The ZrBr2 may be grown epitaxially on Si(111). This method was disclosed in an oral paper given by Antoine Fleurence at the March 2011 Meeting of the American Physical Society, on 24th March in Dallas, Tex., US (abstract ID: BAPS.2011.MAR.V10.9).

Any suitable material may be used instead of the PMMA block 54 (e.g. any suitable polymer). For example, thermal release tape may be used instead of the PMMA block. In an embodiment, attachment of the Silicene layer 51 to the PMMA block 54 (or equivalent) may be omitted. Where this is the case, the Silicene layer 51 provided on the single-crystal silver layer 53 (or other suitable material) supported by the substrate 52 is pressed onto the multilayer stack 49. The single-crystal silver layer 53 (or other suitable material) and the substrate 52 are then etched away to leave behind the Silicene layer on the multilayer stack 49 (as shown in FIG. 5e).

Known transfer methods which are used to transfer Graphene to a surface of interest may be used to transfer the Silicene layer 51 to a surface of interest, for example transfer methods described in Lee, Seunghyun et al., Nano Letters, vol. 10, issue 11, pp. 4702-4707, which is herein incorporated by reference.

The Silicene layer 51 protects the multilayer stack 49 of the multilayer mirror 50. It is known in the prior art to provide a cap layer of Ruthenium on a multilayer stack 49 of a multilayer mirror in order to protect the multilayer stack 49. However, the Ruthenium layer may suffer from oxidation, and may also suffer from hydrogen-induced outgassing when tin contamination accumulates on the Ruthenium (tin accumulation may occur in an EUV lithographic apparatus). Furthermore, the Ruthenium may suffer from associated effects such as blistering and etching of the Ruthenium. One or more of these problems may be avoided by the Silicene layer 51.

Silicene nano-ribbons have shown strong resistance to oxidation. This strong resistance is due to the $sp^2$ hybridization of the Si valence orbitals. Typically, oxygen uptake by Silicene starts at oxygen doses which are around $10^4$ higher than oxygen uptake by clean Si. This indicates that Silicene has a low reactivity to molecular oxygen. More information regarding Silicene's resistance to oxidation may be found in Paola De Padova et al., 2011 J. Phys. D: Appl. Phys. 44 312001, which is herein incorporated by reference.

The use of Silicene as a membrane, pellicle, a spectral purity filter or capping layer for use with EUV radiation may be particularly advantageous. It is believed that the affinity of tin contamination to adhere to Silicene is significantly less than the affinity of tin contamination to adhere to Ruthenium. Thus, tin contamination build up on Silicene may be slower than tin contamination build up on Ruthenium. Consequently, unwanted effects arising from the build up of tin, such as tin induced blistering and etching, may be reduced. This may help for instance to extend the lifetime in an EUV lithographic apparatus of a mirror which has been provided with a Silicene cap layer (compared with a mirror which has been provided with a Ruthenium cap layer), which is especially useful for a source collector apparatus SO where contamination with tin or alike plasma fuel may occur with a higher rate.

The Silicene layer 51 is shown in FIG. 4 as being directly located on top of the multilayer stack 49. However, a layer of some other material may be present between the multilayer stack 49 and the Silicene layer 51. For example a layer of Ruthenium may be present between the multilayer stack 49 and the Silicene layer 51 (the Silicene layer for example being provided on a multilayer mirror which has already been capped with a Ruthenium layer).

Silicene may be resistant to damage from hydrogen radicals. Thus, the Silicene cap layer may be substantially undamaged by hydrogen radicals which may be present in the EUV lithographic apparatus (the hydrogen radicals are generated by the interaction of EUV radiation with hydrogen gas in the lithographic apparatus). It is believed that the hydrogen atoms will hydrogenate the Silicene in a manner similar to the hydrogenation of Graphene to Graphane. The hydrogenated material may be referred to as Silicane.

In an embodiment more than one layer (i.e. multiple layers) of Silicene may be provided on the multilayer stack 49. This may be achieved for example by using the process illustrated in FIG. 5 to first provide a single Silicene layer 51 on a multilayer mirror 50, then repeating the process such than a second layer of Silicene attached to a PMMA block is pressed onto the layer of Silicene already provided on the multilayer mirror. When the PMMA block is etched away this leaves behind two Silicene layers on top of the multilayer stack 49. Additional Silicene layers may be added in the same manner.

In an embodiment, a Silicene layer may be provided on a metal layer of a grazing-incidence reflector (collector). The grazing incidence reflector may for example be one off the grazing incidence reflectors 254-255 shown in FIG. 2. The Silicene layer may be provided on the metal layer of the grazing incidence collector using a method which corresponds with the method shown in FIG. 5 and described further above. Silicene layers may for example be provided on metal reflective surfaces of all of the grazing incidence reflectors 254-255 and/or the collector CO (typically comprising a multilayer stack 49) shown in FIG. 3. A Silicene layer may be provided on any metal reflector.

The multilayer mirror 50, grazing incidence reflectors 254-255 and collector CO are all examples of reflectors. Silicene cap layers may be provided on other reflectors.

In an embodiment as mentioned above, instead of forming Silicene as a layer which is then pressed onto a reflector, the Silicene may be formed as flakes which are caused to adhere to the reflector and thereby form a Silicene cap layer on the reflector (the flakes for example being pieces a few microns in length comprising a plurality of single layers of Silicene coupled to each other in a structure of any shape). The Silicene flakes may for example be made using one of the methods described further above, and may then be placed in a solution. The reflector to be capped may then be placed in the solution. Dielectrophoresis may be used to attract the Silicene flakes to the reflector and trap the Silicene flakes on the surface of the reflector. The Silicene flakes may build up on the surface of the reflector, thereby forming a cap layer. This method may be used to form a Silicene cap layer on any suitable reflector. An example of this method in the context of Graphene flakes is described in B. R. Burg et al., 2010 Journal of Applied Physics 107 034302, which is herein incorporated by reference. The Silicene flakes may be in an unordered arrangement which forms a layer in which different shapes and sizes of flake are attached to one another within the layer via Van der Waals' forces.

In an embodiment, Silicene flakes may be prepared using a procedure which is similar to the procedures employed to produce Graphene flakes in solution. For example, a procedure may begin with a PMMA/(Silicene multilayer) stack. The Silicene may then be dispersed in an organic solvent with nearly the same surface energy associated with the Silicene multilayer. By doing this an energy barrier to detaching a Silicene layer from another is reduced. The dispersion is achieved by sonicating in an ultrasound bath for several hours the PMMA/(Silicene multilayer) and the organic solvent. After dispersion the solution is centrifuged in order to precipitate thicker flakes. For this process, stabilisation of the flakes (i.e. avoiding them sticking together) may be achieved by the use of surfactants. Another method which has previously been described in relation to Graphene and which may be used consists of pre-oxidation of Silicene, allowing the dispersion of Silicene flakes (using ultrasound) to be performed in water (since Silicene oxide is expected to be hydrophilic). Reduction of the oxidized Silicene is then performed using chemical methods in order to obtain Silicene. Methods may be adapted from methods of preparing Graphene flakes which are described in Lotya et al, ACS Nano 4, 3155-2339 (2011) and Su C Y et al, ACS Nano 5, 2332-2339 (2011), both of which are herein incorporated by reference.

Figure 6:
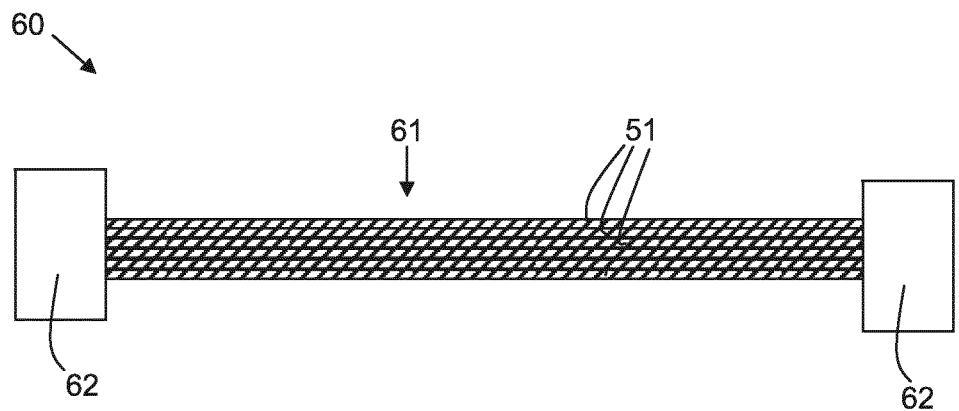
FIG. 6 is a schematic illustration of a pellicle according to an embodiment of the invention.

In an embodiment a plurality of layers (i.e. multiple layers) of Silicene may together be used to form a Silicene pellicle which could for example be used to protect the patterning device MA of the EUV lithographic apparatus (see FIGS. 1 and 2). An example of such a pellicle is shown schematically in cross-section in FIG. 6. The pellicle 60 comprises a plurality of layers of Silicene 51 which are pressed together to form a multilayer Silicene structure 61. The Silicene structure 61 is supported around its perimeter by a supporting structure 62 (e.g. a frame). The supporting structure 62 may be arranged to hold the pellicle at a fixed distance from the patterning device. In an alternative embodiment, a Silicene pellicle comprising a single layer of Silicene may be provided. For such a pellicle a meshed structure (such as a grid) or a support layer may be used to support the pellicle in order to provide more stiffness to the single Silicene layer.

The use of a pellicle is known as a way of preventing debris (e.g. contaminant or dust particles) from coming into contact with the reticle. Any debris which comes to rest on the patterning device, such as a reticle, may cause substantial degradation in the imaging performance of the lithographic apparatus because the reticle (and hence the debris in contact with the reticle) is in the focal plane of the lithographic apparatus. The pellicle covers the reticle and prevents debris from reaching the reticle. Any debris which comes to rest on the pellicle will not be in the focal plane of the lithographic apparatus and therefore any degradation in the imaging performance of the lithographic apparatus caused by the debris will be much less than if the debris had come to rest directly on the reticle.

The use of Silicene to form a pellicle has several advantages which include a high mechanical strength, a high degree of uniformity (in terms of both thickness and composition), a high transparency to EUV radiation, and a high degree of thermal stability (i.e. it is substantially unaffected by changes in temperature which may occur within a lithographic apparatus). Silicene's mechanical strength avoids the need to support the pellicle using a grid, and thus avoids the non-uniformity of EUV radiation that a grid would introduce. In an embodiment, a grid may be used to provide some support to the silicone pellicle or membrane.

In an embodiment the pellicle may also comprise two Silicene sheets sandwiched between layers of support material such that the pellicle is formed from a stack of alternating layers as follows: support material, Silicene sheet, support material, Silicene sheet, support material. Using the support material in addition to Silicene may provide the advantage that it improves mechanical properties of the pellicle. The Silicene may act as an anti-diffusion barrier. Silicene flakes may also be used instead of a Silicene layer.

Silicene may also be used in the construction of spectral purity filters. Known radiation sources within lithographic apparatus, such as laser produced plasma (LPP) sources, may produce in-band radiation (which may be used to pattern the substrate) and out-of-band radiation. The in-band radiation may for example be extreme ultraviolet (EUV) radiation, whereas the out-of-band radiation may be infrared radiation. The out-of-band radiation may be reflected by the same reflectors which direct the in-band radiation to the substrate. It may be undesirable that the out-of-band radiation is reflected by the lithographic apparatus onto the substrate because the out-of-band radiation may have a detrimental effect on the substrate. For example, in the case where the out-of-band radiation is infrared radiation, the infrared radiation may cause the substrate to be heated. Heating of the substrate may cause the substrate to expand. Expansion of the substrate may result in reduced imaging performance of the lithographic apparatus. For example, images projected onto different layers of the substrate may not align with one another. This may be referred to as an overlay problem.

Spectral purity filters are a known way of suppressing the transmission of out-of-band radiation (for example infrared and/or DUV radiation) through the lithographic apparatus to the substrate. Known spectral purity filters suffer from the fact that the materials which are used to prevent the transmission of the out-of-band radiation (i.e. by absorption and/or reflection) also prevent the transmission of useful in-band EUV radiation. Because the amount of absorption of the in-band radiation by the spectral purity filter increases with increasing thickness of the spectral purity filter, known spectral purity filters for use with EUV radiation are thin (e.g. 50 to 100 nanometers thick) so as to minimize EUV radiation absorption. Due to the fact that these spectral purity filters are so thin, they may be very fragile (i.e. they have a low mechanical strength). It is therefore very difficult to handle and position such spectral purity filters within the lithographic apparatus. As previously discussed, Silicene is a material which has a high mechanical strength and also permits substantial EUV radiation to be transmitted through it. The filter made of Silicene could be in a form of a homogeneous layer or in form of a layer formed by Silicene flakes. A mixture of Silicene and some other suitable material (e.g. some other suitable metal) may be used in an equivalent manner to form the spectral purity filter.

Figure 7:
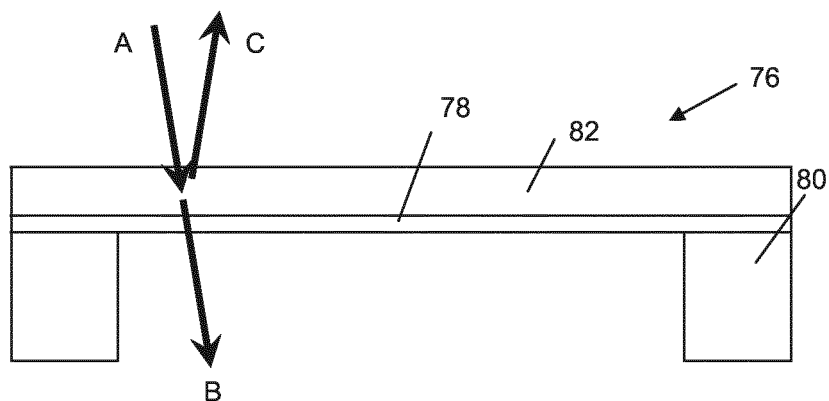
FIG. 7 is a schematic illustration of a spectral purity filter according to an embodiment of the invention.

FIG. 7 shows a spectral purity filter 76 which includes a Silicene sheet 78. By sheet 78 herein is meant a single layer or a homogeneous layer formed by multiple layers. The Silicene sheet 78 is disposed upon a spectral purity filter frame 80. The Silicene sheet 78 supports an out-of-band radiation suppression structure 82. The out-of-band radiation suppression structure 82 may comprise a single or multi-layered structure which is capable of suppressing the transmission of out-of-band radiation through the spectral purity filter. FIG. 7 shows a radiation beam A which is incident on the spectral purity filter. The incident radiation beam may comprise both in-band radiation and out-of-band radiation. The in-band radiation B passes through the out-of-band radiation suppression structure 82 and Silicene sheet 78 and may then pass to the patterning device and hence the substrate. The out-of-band radiation may be absorbed by the out-of-band suppression structure 82 (absorption of out-of-band radiation not shown) or may be reflected away from the spectral purity filter 76 as indicated by C. The Silicene sheet 78 acts to support the potentially thin out-of-band radiation suppression structure 82 and therefore makes the spectral purity filter easier to handle and locate within a lithographic apparatus. In addition, the Silicene may also prevent oxidation of the out-of-band radiation suppression structure 82, since Silicene is impermeable to oxygen. Both sides of the out-of-band radiation suppression structure 82 may be covered with Silicene if it is desired to prevent oxidation of the out-of-band radiation suppression structure.

Figure 8:
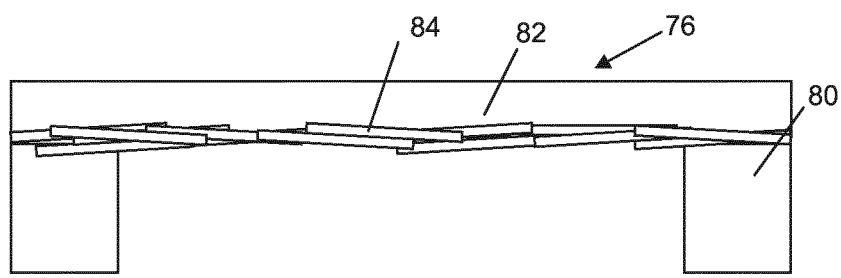
FIG. 8 is a schematic illustration of a spectral purity filter according to an alternative embodiment of the invention.

FIG. 8 shows a similar spectral purity filter to that shown in FIG. 7. In this embodiment, the Silicene sheet 78 of the spectral purity filter shown in FIG. 7 is replaced by Silicene flakes 84. The Silicene flakes 84 may be in an unordered arrangement which forms a layer in which different shapes and sizes of flake are attached to one another within the layer via Van der Waals' forces. In some spectral purity filters Silicene flakes may be advantageous compared to Silicene sheets. This is because Silicene flakes may be less expensive than Silicene sheets, and may be easier to process.

A spectral purity filter with a multi-layered structure may also be construed. Such spectral purity filter may comprise for example six alternating layers: three Silicene sheet layers and three out-of-band radiation suppression structure layers. This spectral purity filter may be advantageous because a large total thickness of out-of-band radiation suppression layers can be supported by a plurality of Silicene sheet layers. Due to the fact that multiple Silicene sheet layers are provided amongst the out-of-band radiation suppression structure layers, the spectral purity filter may have a greater mechanical strength compared to a spectral purity filter with a single out-of-band radiation suppression layer and a single Silicene sheet layer. It will be appreciated that within this embodiment the Silicene sheet layer may be replaced with layers made out of Silicene flakes as described above.

It is desirable in a multi-layer mirror to provide well defined boundaries between adjacent layers (e.g. between a layer of Molybdenum and a layer of Silicon). Over time diffusion may occur between adjacent layers such that the boundaries between them become less well defined. The diffusion may in part be due to the mirrors being heated during operation of the lithographic apparatus. Silicene may be used as an anti-diffusion layer located between adjacent layers, the Silicene acting to maintain well defined boundaries between the adjacent layers. Silicene is suited to use as an anti-diffusion layer because it is non-permeable and may be provided in a thin layer (e.g. less than 1 nm thick) such that it absorbs very little EUV radiation. Because Silicene is able to withstand high temperatures it may allow multi-layer mirrors to withstand higher temperatures than conventional multi-layer mirrors. The multi-layer mirror may for example be constructed by growing a layer of Molybdenum or Silicon onto the substrate (e.g. using chemical vapour deposition), manually applying a sheet of Silicene onto the layer, growing the next layer, etc.

A single layer or plurality of silicone layers may also be used to manufacture a membrane capable of preventing both fast moving and slow moving contamination particles from reaching other surfaces within the lithographic apparatus or an EUV source. Preferably the membrane is gas-tight.

Figure 9:
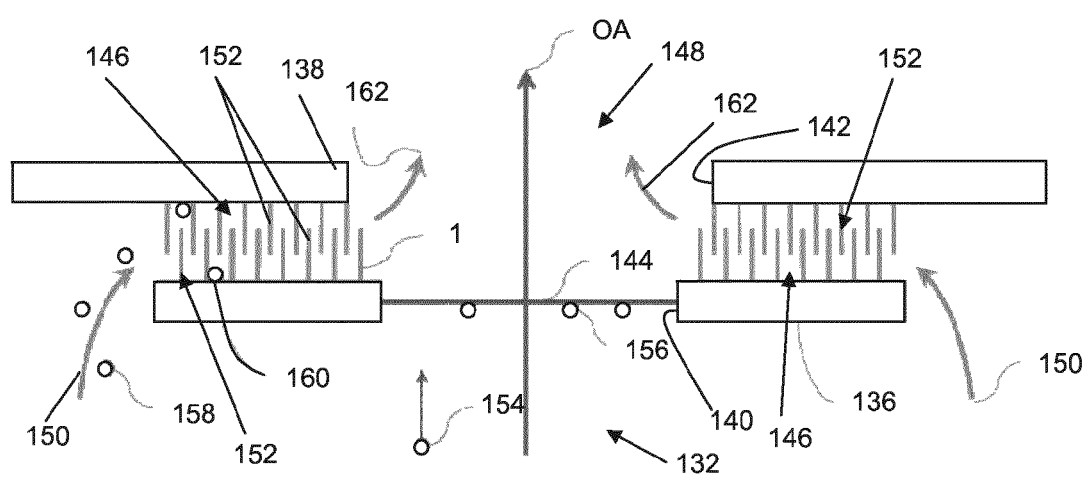
FIG. 9 is schematic illustration of a membrane and particle trapping structure according to an embodiment of the present invention.

FIG. 9 shows a schematic cross section through a portion of the lithographic apparatus indicated by 34 in FIG. 2. The portion of the lithographic apparatus shown in FIG. 9 is capable of preventing both fast moving and slow moving contamination particles from reaching the patterning device MA. The portion of the lithographic apparatus shown in FIG. 9 comprises first and second wall members 136, 138 which may form part of walls of the illumination system IL of the lithographic apparatus. The first and second wall members 136, 138 comprise respective openings 140, 142. The openings 140, 142 share a common axis which is the optical axis OA of the beam of radiation 21 of the lithographic apparatus. The opening 140 in the first wall member 136 comprises a gas-tight Silicene membrane 144 which is secured across the opening 140 so as to prevent the passage of gas from one side of the first wall member 136 to the other side of the first wall member 136 via the opening 140.

The first and second wall members 136, 138 are spaced from one another such that there is at least one gas flow path between them. In the embodiment shown in FIG. 9 there are two gas flow paths 146, one on either side of the optical axis OA. The gas flow paths 146 allow gas to flow from inside the illumination system IL to outside the illumination system (outside the illumination system is indicated generally by 148). The path of gas from inside the illumination system IL to outside 148 the illumination system is indicated generally by the arrows 150. The gas flow paths 146 are defined by particle trapping structures 152. The particle trapping structures 152 comprise a plurality of plates 152. The plates 152 extend in a direction parallel to the optical axis OA and extend alternately from the first wall member 136 and the second wall member 138. The plates 152 are spaced from one another and extend in an interdigitated manner so that they overlap in a direction perpendicular to the optical axis OA. The plates 152 of the particle trapping structures 152 therefore ensure that there is no line of sight path for gas to flow from inside the illumination system to outside 148 the illumination system. The plates 152 confine gas flow through the particle trapping structure 152 such that it follows an indirect path. In this case the indirect path is a meandering one, i.e. the path changes direction multiple times as it progresses towards outside 148 the illumination system. For example, the path may change direction at least four times as it progresses towards outside 148 the illumination system. The changes in direction of the path may be abrupt. In the present embodiment, the meandering path is boustrophedonic, meaning that the gas flows in one direction and then turns to go in the opposite direction whilst it progresses towards outside 148 the illumination system. In an embodiment where the length of each plate 152 (parallel to the optical axis OA in use) is approximately 10 times the separation between adjacent plates 152, such a pair of adjacent plates may prevent approximately 90% of the contamination particles from passing between the adjacent pair of plates. In some embodiments, it may be advantageous for the particle trapping structure to reduce the level of contamination particles by 6 or 7 orders of magnitude. In these embodiments it may be desirable to use at least 5 pairs of adjacent plates (i.e. 10 plates). It will be appreciated that any appropriate number of plates may be used. For example, there may be between 2 and 100 plates. In some embodiments, the use of curved plates (i.e. plates where there is no line of sight path through the gap between an adjacent pair of plates) may increase the proportion of contamination particles which are prevented from passing between the adjacent pair of plates compared to planar plates. It follows that less pairs of curved plates may be required (compared to planar plates) to prevent a given proportion of contamination particles from passing through the contamination trapping structure.

In use, the openings 140, 142 are arranged within the lithographic apparatus so that the beam of radiation passes through the openings 140, 142, including passing through the membrane 144. The material and thickness of the membrane 144 is chosen so that it permits the radiation beam 21 to pass through it. It will be appreciated that in some embodiments of the invention the membrane 144 may not permit 100% of the incident radiation to pass through it.

The thickness and material of the membrane 144 is also chosen so that contamination particles travelling at fast speeds in the direction of the radiation beam 21 can strike the membrane 144 without causing degradation of the membrane 144 to an extent that it becomes no longer gas-tight.

The membrane 144 is also able to withstand the pressure created by the collisions of many fast moving contamination particles with the membrane 144 without the 5 membrane 144 degrading such that it is no longer gas-tight. For example, the membrane may need to withstand a pressure of approximately 1 GPa to 10 GPa created by a Sn particle. It is thought that the rate of collisions may be of the order of about 1000 collisions per second. The size of the fast moving contamination particles may be in the range of approximately 150 nanometers to approximately 1 IJm. The particles may be travelling at 10 speeds of approximately 100 meters per second to approximately 1000 meters per second. It will be appreciated that there may be a variety of different sized particles colliding with the membrane 144 at a variety of speeds. Furthermore, the rate of collisions of the fast moving particles of the membrane 144 that occur may not be constant with time.

A fast moving contamination particle travelling in the same direction as the radiation beam 21 within the illumination system IL is indicated by 154. Fast moving contamination particles which are moving in the same direction as the radiation beam 21 (such as that indicated by 154) collide with the membrane 144 and either become impacted in the membrane 144 (as indicated by 156) or rebound (not shown) from the membrane 144. Fast moving contamination particles which rebound from the membrane 144 may lose energy as they rebound. This loss of energy may cause fast moving contamination particles which rebound off the membrane to become slow moving contamination particles which continue to move within the illumination system. If the fast moving contamination particles become slow moving contamination particles, they may subsequently be trapped within the particle trapping structure 152.

An example of a range of thicknesses of membrane 144 which may be used is about 10 nanometers to about 500 nanometers. For example, the membrane may be in a range of 10 to 100 nanometers thick. The Silicene membrane may be formed by a single sheet of Silicene, a plurality of Silicene sheets or a composite of Silicene flakes. A membrane having multiple layers may also be may be formed from different materials and it may also have a sandwich structure as described above. A combination of a Silicene membrane to prevent fast moving contamination particles passing through it and a particle trapping structure configured to collect slow moving contamination particles will result in a lithographic apparatus which is capable of preventing both fast and slow moving contamination particles from reaching the patterning device MA.

The membrane and particle trapping structure may be located in various locations within the EUV source or in the lithographic apparatus. One location may be for instance within the illumination system IL adjacent to the patterning device MA. The membrane and particle trapping structure may also be positioned at the end of the illumination system which is closest to the intermediate focus IF. Additionally or alternatively, the membrane and particle trapping structure may be located within the source module SO, for example at a position between the collector and the intermediate focus IF. In a further alternative embodiment, the membrane may be such that it forms both part of the illumination system IL (the membrane being intermediate optics within the illumination system and the patterning device) and part of the projection system PS (the membrane also being intermediate optics within the projection system and the patterning device). In this embodiment, the membrane separates the patterning device from both the illumination system and the projection system. The membrane may define, in part, a chamber within which the patterning device is situated. It will be appreciated that in this embodiment, the beam of radiation will pass through the membrane twice: once when it travels from the illumination system to the patterning device and once when it travels from the patterning device to the projection system. The illumination system and projection system may each comprise a chamber which is defined in part by the membrane. The membrane may be provided after the source module SO and before optics of the illumination system IL. It will also be appreciated that a lithographic apparatus according the present invention may comprise more than one membrane. A membrane formed from Silicene may be provided at any suitable location in the lithographic apparatus. The membrane may for example be configured to stop the passage of contamination particles through the lithographic apparatus.

It will be appreciated that although the indirect gas flow path 46 defined by the particle trapping structures 52 in the described embodiment is meandering (specifically, boustrophedonic), any appropriate structure which creates an indirect gas flow path may be used. For example, the path may be labyrinthine. It will further be appreciated that the particle trapping structure may take any appropriate form. The particle trapping structure should be capable of permitting a flow of gas from inside a chamber (in this case the illumination system IL) to outside the chamber, whilst at the same time substantially preventing the passage of contamination particles within the gas from inside the chamber to outside the chamber. Another example of a possible particle trapping structure is a sponge-like material which is porous to the gas but impermeable to the contamination particles within the gas. Examples of suitable sponge-like materials include sponge-like materials constructed from metals. It is desirable that the material used to construct the sponge like material is non-reactive in the atmosphere in which the particle trapping structure of which it forms part will be used. For example, if the particle trapping structure (and hence the sponge-like material) is to be used in a hydrogen atmosphere, then appropriate, non-reactive metals include Aluminium (Al), Tungsten (W), ruthenium (Ru) and molybdenum (Mo). The sponge-like material comprises a lattice defining a plurality of cavities. The sponge-like material may permit gas to flow from inside the chamber to outside the chamber along an indirect path. The path of the gas through the sponge-like material is indirect because the gas travels in a non-straight line path through a series of adjacent cavities within the sponge-like material.

It will be appreciated that within the particle trapping structure of the described embodiment, the slow moving contamination particles within the gas become attached to the walls which define the indirect gas flow path 146 through the particle trapping structures 152. The attachment of the contamination particles to the walls defining the indirect gas flow path 146 of the particle trapping structure 152 may be caused by Van der Waals' forces between the contamination particles and the wall members. In some embodiments it may be desirable to coat the particle trapping structure with a substance which improves the ability of the contamination particles to stick to the walls defining the indirect gas flow path 146 of the particle trapping structure 152. For example, the walls may be coated in an adhesive or the like. Also, in some embodiments the particle trapping structures may be heated so as to improve the attachment of contamination particles within the gas to the walls which define the indirect gas flow path 146 of the particle trapping structures 152.

Within the described embodiment, the membrane 144 is adjacent two separate particle trapping structures 152. It will be appreciated that a lithographic apparatus according to the present invention may comprise only one particle trapping structure or alternatively may comprise more than two. Furthermore, any particle trapping structure may be located at a position remote to the membrane.

In another embodiment, the spectral purity filter may for example comprise a grid which has a pitch that is smaller than the wavelengths of radiation that it is intended to block. For example, the grid may have a pitch of around 5 microns and may be used to block infrared radiation having a wavelength greater than around 10 microns. The grid may for example be formed from hexagonal cells, e.g. having a honeycomb grid form. Ribs which form the hexagonal cells may for example be around 500 nanometers thick. The grid may for example be formed from a metal such as tungsten which is capable of withstanding the substantial heat load generated by infrared radiation and which has a high emissivity. The outer surface of the tungsten grid will oxidize to form tungsten oxide when it is in the atmosphere, for example during construction of an EUV lithographic apparatus. When the EUV lithographic apparatus is operating, tungsten oxide will evaporate from the grid when it is exposed to infrared radiation. Some of the tungsten oxide may accumulate on optical surfaces of the EUV lithographic apparatus, decreasing their reflectivity and thereby decreasing the intensity of EUV radiation available for projection onto a substrate. Conventional cleaning techniques are not capable of removing tungsten oxide from the optical surfaces. It is therefore desirable to prevent tungsten oxide from the grid contaminating the EUV lithographic apparatus.

Figure 10:
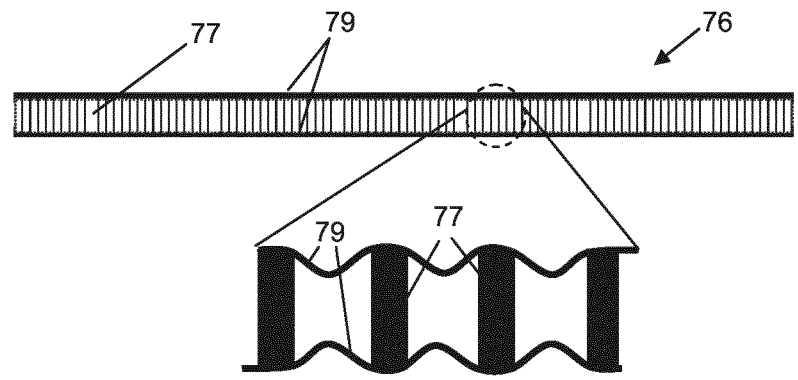
FIG. 10 is a schematic cross sectional view through an embodiment of a spectral purity filter which may form part of a lithographic apparatus according to the invention.

Silicene may be used to protect the tungsten grid from oxidation and/or to prevent out-gassing of tungsten oxide from the grid. FIG. 10 shows schematically in cross-section an embodiment in which a spectral purity filter 76 comprises a tungsten grid 77 (or grid formed from some other suitable metal), a layer of Silicene 79 being provided on either side of the grid. The Silicene may be applied such that none of the tungsten grid 77 is exposed. The Silicene layers 79 are not permeable to oxygen, and therefore will prevent oxidation of the tungsten grid 77. The Silicene layers 79 may for example be applied as sheets of Silicene to the tungsten grid 77. This may be done when the tungsten grid is in a vacuum (e.g. when a layer of tungsten oxide is not present on the tungsten grid). Once the Silicene layers 79 are in place the spectral purity filter 76 may be exposed to the atmosphere. The Silicene layers 79 prevent oxidation of the tungsten grid 77 and therefore prevent a layer of tungsten oxide from building up on the tungsten grid.

The Silicene layers 79 may seal cells which comprise the grid (e.g. hexagonal cells in the case of a honeycomb structure). As a consequence of this, the pressure within the cells may be significantly different from the pressure outside of the cells. For example, there may be a vacuum within the cells and atmospheric pressure outside of the cells. The Silicene layers 79 will be sufficiently strong to withstand forces arising from these pressure differences (a single atomic sheet of Silicene can hold a pressure difference of vacuum to the atmosphere over a 5 micron pitch grid). The Silicene layers 79 may bend inwards as a result of the pressure difference, as is represented schematically in FIG. 10.

Figure 11:
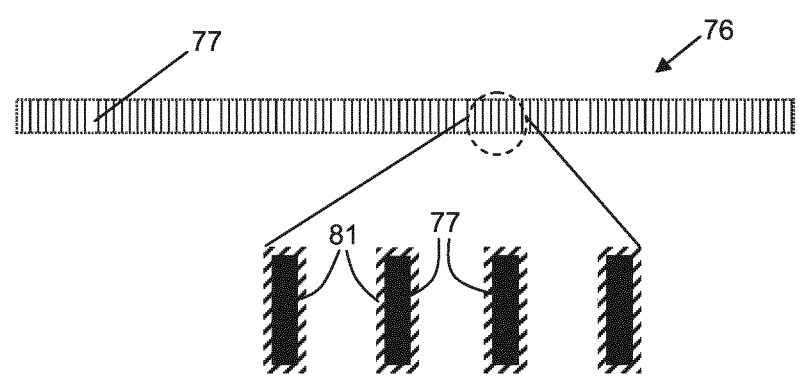
FIG. 11 is a schematic cross sectional view through an embodiment of a spectral purity filter which may form part of a lithographic apparatus according to the invention.

In an alternative embodiment, shown schematically in FIG. 11, instead of providing Silicene layers on either side of a tungsten grid, Silicene is used to surround individual ribs of the grid. The spectral purity filter 76 comprises a grid 77 formed from tungsten (or some other suitable metal), each rib of the grid being surrounded by Silicene 81. The Silicene 81 is applied such that none of the tungsten grid 77 is exposed to the atmosphere, and therefore prevents oxidation of the tungsten grid and prevents a layer of tungsten oxide from building up on the tungsten grid.

The embodiment shown in FIG. 11 may for example be made by sputtering Silicene flakes onto the grid 77. Alternatively, a sheet of Silicene may be placed on top of the grid 77 and then broken up by blowing air onto it such that the Silicene breaks up and adheres to ribs of the grid.

Tungsten grid spectral purity filters may have a limited lifetime. A primary reason for the limited lifetime is that tungsten grain forms when the grid is at high temperatures (which will occur during operation of the lithographic apparatus). The tungsten grain causes the grid to become fragile such that it may eventually break.

Figure 12:
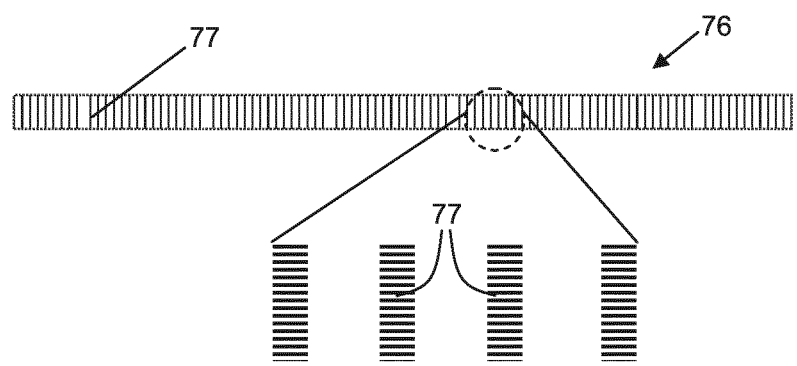
FIG. 12 is a cross sectional view through an embodiment of a spectral purity filter which may form part of a lithographic apparatus according to the invention.

In an embodiment, the formation of tungsten grain in a spectral purity filter grid may be prevented or reduced by constructing the grid as a tungsten/Silicene multi-layered structure. The Silicene in such a multi-layered structure acts as a barrier which prevents the formation of large tungsten grains. The Silicene does not have a significant effect upon properties of the tungsten such as the tungsten melting temperature. An example of a spectral purity filter 76 comprising a grid formed from ribs 77 which comprise a tungsten/Silicene multi-layered structure is shown schematically in FIG. 12. The thickness of the tungsten layers of the spectral purity filter may be smaller than the width of the ribs 77 in order to limit the formation of tungsten grains such that they cannot have a size which exceeds the width of the ribs. For example, the ribs may be 500 nanometers thick. The tungsten layers may be 100 nanometers thick or less, and may be 50 nanometers thick or less. The Silicene layers may for example be less than 1 nanometer thick.

A multi-layered grid structure comprising Silicene and some other suitable material (e.g. some other suitable metal such as Rhenium) may be used to form the spectral purity filter.

In an embodiment, instead of using a multi-layered structure to form the spectral purity filter grid, the grid may be formed from a mixture of Silicene and tungsten. This may be achieved for example by mixing Silicene with tungsten and then sputtering the Silicene and tungsten together onto an optical component (e.g. an optical component of an EUV lithographic apparatus). Forming the spectral purity filter grid from a mixture of Silicene and tungsten may help to reduce the formation of tungsten grains. It may be desirable to use more tungsten than Silicene in order to retain desirable properties of tungsten such as good heat resistance and high emissivity. The proportion of Silicene to tungsten may be relatively low, for example 5% or lower, and may be 1% or lower.

A mixture of Silicene and some other suitable material (e.g. some other suitable metal) may be used in an equivalent manner to form the spectral purity filter.

In some instances, tungsten grains may become detached from the grid 77 and may cause contamination in the EUV lithographic apparatus. Silicene may be used to cover the grid 77 or surround constituent parts of the grid, for example as shown in FIGS. 9 and/or 10. Where this is done the Silicene may act as a barrier which prevents tungsten grains from contaminating the EUV lithographic apparatus.

In an embodiment, a plurality of layers of Silicene may be obtained by generating single layers of Silicene and pressing them together in the manner described above. The resulting layers of Silicene may be provided on a substrate which may be etched away, leaving behind a structure comprising multiple layers of Silicene. The multiple layers of Silicene may then be attached to the support structure.

In an alternative approach, a layer of Silicene may be provided on a substrate such as PMMA (e.g. as described further above), and this may be folded such that Silicene surfaces come into contact with one another (i.e. forming the structure: PMMA/Silicene/Silicene/PMMA). One of the PMMA layers could then be etched away, and the process could then be repeated, i.e. forming the structure: PMMA/Silicene/Silicene/Silicene/Silicene/PMMA. The process could be repeated enough times to obtain a desired number of Silicene layers.

Although the multilayer mirror 50 described above comprises alternating layers of Molybdenum and Silicon, the multilayer mirror may be formed from any suitable materials.

Although Silicene is referred to above, Silicene derivatives may be used in mirrors, spectral purity filters, etc of an EUV lithographic apparatus and all the above presented embodiments are also possible to be construed using a Silicene derivative instead of (or in case of for example multiple layers or sheets, in combination with) Silicene. Silicene derivatives may comprise a functionalised Silicene structure for example with H, halogen or radicals and may include for example silicane, Silicene fluoride, Silicene bromide, Silicene chloride and Silicene iodide. The mechanical properties of Silicene derivatives may be the same or similar to the mechanical properties of Silicene, although the chemical properties may be different.

Besides Silicene and its derivatives referred above for various embodiments, also fullerene and/or fullerene derivatives may be used instead of Silicene and/or Silicene derivatives for the same purpose. Fullerenes are the third allotropic form of carbon (after graphite and diamond). A fullerene is a molecule formed entirely from carbon, the molecule being in the form of a hollow sphere, ellipsoid, tube, or some other form. Spherical fullerenes may contain pentagonal and hexagonal rings. The spherical form of fullerene is sometime referred to as $C_{60}$ and may also be referred to buckminsterfullerene.

The fullerene thus may for example be $C_{60}$ fullerene, or may be any other form of fullerene, for example $C_{70}$, $C_{72}$, $C_{76}$, $C_{84}$ or $C_{100}$. Fullerenes carrying a functionality are herein denoted as fullerene derivatives, in an analogous manner such as described above for Silicene derivatives. Examples of fullerene derivatives are for example halogen-containing fullerenes such as $C_{60}F_{18}$, $C_{60}F_{36}$, $C_{60}F_{48}$, $C_{60}Cl_{30}$, $C_{60}Br_{24}*2Br_2$, hydrogenated fullerenes, or fullerenes comprising radicals such as —OH radical.

The fullerene and/or its derivatives may thus also be used to provide a (cap) layer on a reflector such as a mirror or a reticle having reflective surfaces, or it can be used to manufacture a pellicle for a reticle. Since fullerene and/or its derivatives may be removed by a mild plasma and redeposited, a fullerene based cap layer on an optical element such as a mirror, a sensor, or a reticle may be used as part of a cleaning strategy.

Figure 13:
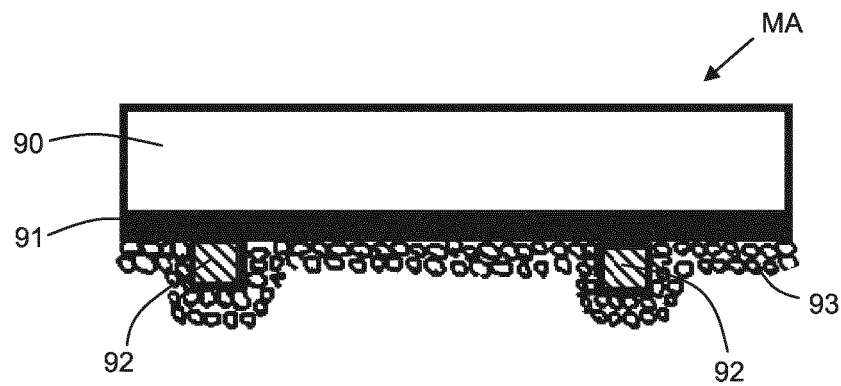
FIG. 13 is a schematic illustration of a mask according to an embodiment of the invention.

FIG. 13 schematically shows a mask MA (which may also be referred to as a reticle) according to an embodiment of the invention. The mask MA may for example be used in a lithographic apparatus as described further above in relation to FIGS. 1 and 2. The mask MA comprises a multilayer stack 90 which is configured to reflect EUV radiation (e.g., radiation in the range 5-20 nanometers). The multilayer stack 90 may for example comprise alternating layers of molybdenum and silicon. The multilayer stack 90 is supported by a substrate (not shown), which may for example be formed from quartz. A layer of ruthenium 91 is provided on top of the multilayer stack 90. The ruthenium layer 91 is a cap layer which protects the multilayer stack 90. A pattern is provided on the mask MA, the pattern being designed to give rise a desired pattern on a substrate W when it is projected by a projection system PS of the lithographic apparatus (see FIGS. 1 and 2). The pattern is formed from EUV radiation absorbing material. This is represented schematically in FIG. 13 by two blocks of EUV radiation absorbing material 92.

It is usual in a conventional DUV lithographic apparatus to provide a pellicle adjacent to a mask. The pellicle protects the mask by forming a barrier which prevents contamination particles from coming into contact with the mask. Contamination particles which are received on the pellicle are away from the focal plane of the lithographic apparatus projection system (i.e., the plane in which the mask is located). As a result, the contamination particles have a negligible impact or no impact upon the pattern which is projected from the mask onto the substrate by the projection system.

In an EUV lithographic apparatus a pellicle may absorb a significant amount of EUV radiation, thereby reducing the amount of EUV radiation which is available to expose substrates using the lithographic apparatus. Attempts have been made to make a pellicle which is very thin and which thus provides relatively low absorption of EUV radiation. However, such pellicles are very delicate and are subject to failure. To avoid this problem an EUV lithographic apparatus which does not include a pellicle may be used. In such circumstances a mask MA as shown in FIG. 13 may be used.

In the mask MA shown in FIG. 13 a layer of fullerene 93 is provided on the mask such that it forms an outer layer of the mask. The fullerene 93 provided on the mask MA may for example be $C_{60}$, or may be some other form of fullerene (e.g. ellipsoids or tubes). Alternatively, a fullerene derivative may be used to form an outer layer of the mask.

A surface capped with $C_{60}$ will have a lower adhesion force for a contamination particle than a surface formed from ruthenium. Consequently, a contamination particle which is incident upon the $C_{60}$ layer 93 of the mask MA is significantly less likely to adhere to the $C_{60}$ than would have been the case if the contamination particle were incident upon the ruthenium layer 91. Thus, the probability of a contamination particle adhering to the mask MA and introducing an error into the projected pattern is reduced. Also other fullerenes (different from $C_{60}$) or fullerene derivatives may be used which provide low adhesion force to the contamination particles. This may allow an EUV lithographic apparatus to operate without a pellicle, thereby avoiding the disadvantages arising from using a pellicle which have been noted further above.

Because $C_{60}$ is hollow, it is expected to have good EUV transmission (this has been observed for carbon nanotubes—a different form of hollow carbon-based material). Thus, the impact of the fullerene on the EUV radiation reflected from the mask M may be low.

The adhesion force of a contamination particle to a $C_{60}$ surface may be expressed as:

$$F_a = \frac{\sqrt{A_{C60} \cdot A_{Al}} \cdot R}{12\sigma^2} \quad (2)$$

where $A_{C60}$ is the Hamaker constant for $C_{60}$ and $A_{Al}$ is the Hamaker constant for aluminium (the likely material of a contamination particle), R is the radius of the aluminium particle (assumed to be 50 nanometers in this example), and is the distance of closest approach (assumed to be 0.4 nanometers in this example). $A_{C60}$ is estimated to be $1.8 \times 10^{-20}$ J and $A_{Al}$ is estimated to be $3.3 \times 10^{-19}$ J. This gives an adhesion force $F_a$ of 1.6 nN.

The adhesion force of a contamination particle to a ruthenium surface may be expressed as:

$$F_a = \frac{\sqrt{A_{Ru} \cdot A_{Al}} \cdot R}{12\sigma^2} \quad (3)$$

where $A_{Ru}$ is the Hamaker constant for ruthenium, and is estimated to be $2 \times 10^{-19}$ J. This gives an adhesion for $F_a$ of 6.7 nN. Thus, it may be seen that the adhesion force between an aluminium particle and ruthenium is roughly four times greater than the adhesion force between an aluminium particle and fullerene.

Data used to estimate the above values may be found in Direct Measurement of the Adhesion and Friction of Smooth C60 Surfaces, Luengo et al, Chem. Mater. 1997, 9, 1166-1171, which is hereby incorporated by reference.

The fullerene (or fullerene derivative) layer 93 may for example be 10 nm thick, or may be thicker than this. A 10 nm thick fullerene layer 93 may, for a double transmission of EUV radiation (i.e. through the fullerene layer 93 onto the mask MA and back through the fullerene layer), provide a transmission of around 89%. The fullerene layer 93 may be sufficiently thick to ensure (e.g. from a manufacturability point of view) that the surface of the mask MA is fully covered by the fullerene (i.e., there are not gaps or patches in the coverage of the mask by the fullerene).

The fullerene layer 93 may for example be provided on the mask MA via evaporation using a Knudsen cell (or any other suitable technique). Evaporation of $C_{60}$ using a Knudsen cell may give rise to a layer of $C_{60}$ with good uniformity, as has been described in Fabrication and Properties of Free-Standing $C_{60}$ Membranes, Eom et al, Science. Vol. 259 no. 5103 pp. 1887-1890, which is hereby incorporated by reference.

Figure 14:
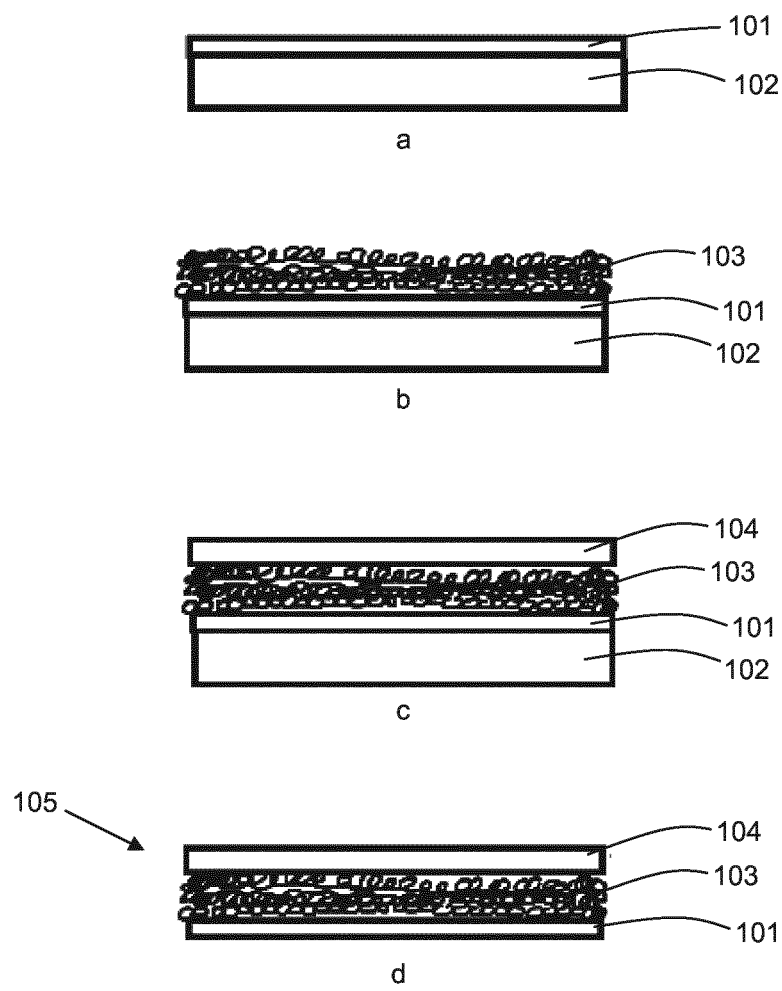
FIG. 14 is a schematic illustration of one way in which a pellicle according to an embodiment of the invention may be made.

In an embodiment, fullerene or a fullerene derivative may be used to form a pellicle, which may for example be used in a lithographic apparatus. The lithographic apparatus may be an EUV lithographic apparatus, for example as described above in relation to FIGS. 1 and 2. A method of forming the pellicle is shown schematically in FIG. 14.

Referring to FIG. 14a, a layer of silicon 101 is provided on a substrate 102. The layer of silicon may for example be a few nanometers thick. A layer of any suitable material may be used instead of the silicon layer 101, for example $Si_xN_x$ (Silicon Nitride), $B_4C$, Mo, MoSi, Zr or Diamond-like carbon (DLC).

Referring to FIG. 14b, a fullerene layer 103 is provided on top of the silicon layer 101. The fullerene layer 103 may be formed via evaporation using a Knudsen cell, or any other suitable technique (e.g. deposition). The fullerene layer 103 may be well-ordered. Layer 103 may also be a fullerene derivative layer.

Referring to FIG. 14c, a silicon layer 104 is then provided on top of the fullerene layer 103. The silicon layer may be formed using any suitable technique, for example evaporation or deposition. The silicon layer may be a few nanometers thick. Again, a layer of any suitable material may be used instead of the silicon layer 104, for example $Si_xN_x$ (Silicon Nitride), $B_4C$, Mo, MoSi, Zr or Diamond-like carbon (DLC).

Referring to FIG. 14d, the substrate 102 is then etched away. This leaves behind a pellicle 105 comprising two silicon layers 101, 104 provided on either side of a fullerene layer 103. The fullerene layer 103, due to the hollow nature of fullerene, provides reasonably good transmission of EUV radiation. At the same time, the fullerene layer 103 provides a relatively strong structure which supports the silicon layers 101, 104. Because the silicon layers 101, 104 have thicknesses of a few nanometers, in the absence of such support they would be significantly more likely to be broken during operation of the lithographic apparatus or during transport or fitting of the pellicle.

As mentioned above, a layer of any suitable material may be used instead of the silicon layer 101, for example $Si_xN_x$ (Silicon Nitride), $B_4C$, Mo, MoSi, Zr or Diamond-like carbon (DLC). These may be considered to be examples of a layer of supporting material. Similarly, a layer of any suitable material may be used instead of the silicon layer 104, for example $Si_xN_x$ (Silicon Nitride), $B_4C$, Mo, MoSi, Zr or Diamond-like carbon (DLC). Again, these may be considered to be examples of a layer of supporting material.

A pellicle as shown in FIG. 14d may be made using a modified process in which the fullerene (or fullerene derivative) layer is initially formed directly on the substrate. Following this, the first silicon layer (or layer of other supporting material) is formed on top of the fullerene layer and the substrate is etched away. The second silicon layer (or layer of other supporting material) is then provided on the side of the fullerene layer where the substrate was previously located. Other ways of fabricating the pellicle 105 of FIG. 14d may be apparent to those skilled in the art.

The pellicle 105 may be held in a supporting structure (not shown). The supporting structure may for example support one or more layers of the pellicle. The supporting structure may for example be a frame.

The thicknesses of the different layers of the pellicle 105 may be selected taking into account that thicker layers will increase the strength of the pellicle but will reduce its transmission of EUV radiation.

Although the pellicle shown in FIG. 14d includes a layer of supporting material on either side of the fullerene layer 103, the pellicle may instead have a layer of supporting material on only one side.

In an embodiment, a pellicle may be constructed which does not include a layer or layers of supporting material, but instead is formed from a suspended layer of fullerene. Referring to FIG. 14d, the pellicle in this case comprises the fullerene layer 103 without supporting layers 101, 104. Fabrication of a suspended layer of fullerene is described for example in Fabrication and Properties of Free-Standing $C_{60}$ Membranes, which is referenced further above.

It has been shown in Fabrication of Free-Standing Fullerene Nanowire Using Direct Electron Beam Writing and Sacrificial Dry Etching; T. Tsuchiya, et al, MEMS 2008, Tucson, Ariz., USA, Jan. 13-17, 2008 (which is hereby incorporated by reference) that $C_{60}$ can be polymerized by irradiating with electrons or photons. That is, irradiating $C_{60}$ molecules with electrons or photons may cause the $C_{60}$ molecules to covalently bind to each other. Thus, the strength of a pellicle made from a suspended layer of $C_{60}$ may be increased by irradiating the $C_{60}$ with electrons or photons such that the $C_{60}$ molecules polymerize. Polymerisation of $C_{60}$ (or other forms of fullerene) may be used in connection with other embodiments of the invention.

In an embodiment, a pellicle may comprise a layer of silicon (or other supporting material) on either side of which a layer of fullerene is provided. The layer of fullerene may for example be a few nanometers thick, or may be thicker than this. The fullerene may for example be $C_{60}$.

A mask MA provided with a layer of fullerene 93 such as shown schematically in FIG. 13 may be cleaned using a method according to an embodiment. It is known that upon exposure to high doses of hydrogen radicals fullerene would be destroyed, as described in Surface Reaction of $C_{60}$ with Atomic Hydrogen: Formation of a Protecting Hydrocarbon Layer, Eremtchenko et al, Fullerenes, Nanotubes, and Carbon Nanostructures, 13: 131-138, 2005, which is hereby incorporated by reference. In a situation in which one or more contamination particles have become attached to the fullerene layer 93 on the mask MA, the mask may be cleaned by directing hydrogen radicals towards the mask such that at least some of the fullerene layer 93 is destroyed. Since the contamination particles are attached to the fullerene layer 93, destruction of the fullerene layer will release the contamination particles. The mask MA may have the orientation shown in FIG. 13 (i.e., with the fullerene layer facing downwards) as a result of which the released contamination particles will fall away from the mask due to gravity. Thus, contamination particles may be removed from the mask MA. Following this the mask MA may be re-used.

Any suitable fullerene etching substance may be used to destroy the fullerene 93, provided that that substance doesn't also destroy the patterned surface of the mask MA. For example, CF4 plasma, Ar plasma or mild hydrogen plasma could be used. A toluene/hexane solution (e.g. 1:6) could be used. If the layer 93 comprises a fullerene derivative, then a corresponding etching substance may be used to destroy said derivative.

Before the mask is re-used the fullerene layer may be repaired or replaced. In the case of repair, the remaining fullerene may be used as a starting point upon which new fullerene is provided. In the case of replacement, a mild plasma etch may be used to remove all of the fullerene from the mask, following which a new fullerene layer may be provided on the mask.

The mask may for example be cleaned in a chamber. The chamber may form part of the lithographic apparatus or may be separate from the lithographic apparatus.

In an embodiment, a mirror of the lithographic apparatus may be provided with a fullerene and/or fullerene derivative layer. The mirror may for example comprise a multilayer stack with a ruthenium layer, a layer of fullerene being provided on top of the ruthenium layer. The layer of fullerene may provide the advantage that it prevents fuel such as tin from coming into contact with the ruthenium and causing ruthenium induced blistering or other unwanted effects. The fullerene may also act as a barrier to ruthenium oxidation. These advantages also apply in relation to a mask MA which is covered by fullerene (e.g. as shown in FIG. 13), or to other surfaces which receive the EUV radiation beam during operation of the lithographic apparatus.

As explained in Surface Reaction of $C_{60}$ with Atomic Hydrogen: Formation of a Protecting Hydrocarbon Layer, which is referenced further above, under high hydrogen radical doses the spherical cage of $C_{60}$ breaks but it leaves a hydrocarbon layer. This hydrocarbon layer may protect $C_{60}$ layers underneath the hydrocarbon later. A hydrocarbon layer formed in this manner may provide advantageous protection to for example a mirror, a mask, a pellicle, or other surface which receives the EUV radiation beam during operation of the lithographic apparatus.

The mirror upon which the fullerene layer is provided may for example be in the projection system PS or illumination system IL of a lithographic apparatus. The fullerene layer may be provided on more than one mirror. The fullerene layer may be provided upon any suitable reflective surface in a lithographic apparatus. This could include, for example, a collector or other reflective optic in the source collector apparatus SO of the lithographic apparatus.

A fullerene layer may be provided as capping layer on a mirror, a mask, a pellicle, or other surface which receives the EUV radiation beam during operation of the lithographic apparatus. The fullerene layer may for example be $C_{60}$ and may for example prevent possible damage to the mirror, mask or pellicle by hydrogen species.

In an embodiment, a spectral purity filter may comprise a first filter which blocks or reduces the intensity of radiation at a first wavelength (e.g. infrared radiation) and a second filter which blocks or reduces the intensity of radiation at a second wavelength (e.g. DUV radiation). The first filter may for example be a honeycomb grid formed from tungsten (or other suitable material), the grid having dimensions which transmit EUV radiation but block infrared radiation. The second filter may for example be a layer of fullerene (e.g. $C_{60}$). $C_{60}$ absorbs DUV relatively efficiently (data is provided in FIG. 2 of Fabrication and Properties of Free-Standing $C_{60}$ Membranes, which is referenced further above). For a 20 nm layer of $C_{60}$, transmission of DUV (e.g. 200-400 nm) may be estimated at 56%, whereas transmission of EUV may be estimated at 89%. Thus, fullerene may be used as a filter which reduces the intensity of DUV radiation. The fullerene layer may be provided on a face of the honeycomb grid (or other infrared filter) which faces away from the radiation source during use, thereby reducing or eliminating incidence of infrared radiation onto the fullerene layer.

In some of the above described embodiments reference has been made to $C_{60}$ fullerene. However, any suitable form of fullerene may be used for any of the embodiments. This may include for example fullerene in the form of hollow spheres, ellipsoids, tubes, or other forms, and may include for example $C_{60}$, $C_{70}$, $C_{72}$, $C_{76}$, $C_{64}$ or $C_{100}$, or some other form of fullerene or fullerene derivative.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims or clauses set out below.

Clauses

1. A reflector comprising a reflecting surface or structure provided with a cap layer formed from Silicene or a Silicene derivative.
2. The reflector of clause 1, wherein the reflecting structure is a multilayer stack.
3. The reflector of clause 1, wherein the reflecting surface is metal.
4. The reflector of any preceding clauses, wherein the cap layer is a single layer of Silicene or a Silicene derivative.
5. The reflector of any of clauses 1 to 3, wherein the Silicene cap layer comprises multiple layers of Silicene or a Silicene derivative, or flakes of Silicene or a Silicene derivative.
6. A pellicle comprising Silicene or a Silicene derivative.
7. The pellicle of clause 6, further comprising one or more layers of supporting material or a supporting structure which supports one or more layers of the pellicle.
8. The pellicle of clause 6 or clause 7, wherein the Silicene or Silicene derivative comprises a plurality of layers or flakes of Silicene.
9. A membrane comprising Silicene or a Silicene derivative held by a supporting structure.
10. A spectral purity filter comprising Silicene or a Silicene derivative.
11. A reflector comprising a reflecting surface or structure comprising Silicene.
12. An apparatus comprising one or more of: the reflector of clause 1, or the pellicle of clause 6, or the membrane of clause 9, or the spectral purity filter of clause 10, or the reflector of clause 11.
13. The apparatus of clause 12, wherein the apparatus further comprises:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

14. A method of applying a cap layer to a reflector comprising forming a layer of Silicene on a material, pressing the layer of Silicene or Silicene derivative onto a surface of the reflector, then etching away the material such that the Silicene or Silicene derivative forms a cap layer on the reflector.
15. A method of making a Silicene or Silicene derivative membrane, the method comprising forming a layer of Silicene or Silicene derivative on a material, forming another layer of Silicene on a material, pressing the layers of Silicene together, then attaching the pressed together layers of Silicene or Silicene derivative to a support structure.
16. The method of clause 15, wherein one or more additional layers of Silicene or Silicene derivative are pressed onto the layers of Silicene or Silicene derivative before the pressed together layers of Silicene or Silicene derivative are attached to the support structure.
17. A method of applying a cap layer to a reflector comprising forming flakes of Silicene or Silicene derivative, placing the flakes of Silicene or Silicene derivative in a solution, placing the reflector in the solution and attracting the flakes of Silicene or Silicene derivative to the reflector to form the cap layer of Silicene or Silicene derivative on the reflector.
18. A lithographic apparatus comprising:
a radiation source configured to produce a radiation beam;
a support configured to support a patterning device, the patterning device being configured to impart the radiation beam with a pattern to form a patterned radiation beam;
a chamber located between the radiation source and the support, the chamber containing at least one optical component configured to reflect the radiation beam, the chamber being configured to permit radiation from the radiation source to pass therethrough; a membrane that defines part of the chamber, the being formed from Silicene or
Silicene derivative membrane and being configured to permit the passage of the radiation beam through the membrane, and to prevent the passage of contamination particles through the membrane; and
a particle trapping structure configured to permit gas to flow along an indirect path from inside the chamber to outside the chamber, the indirect path of the particle trapping structure being configured to substantially prevent the passage of contamination particles from inside the chamber to outside the chamber.
19. A lithographic apparatus according to clause 18, wherein the membrane and particle trapping structure are part of a source collector module or an illumination system of the lithographic device.
20. A lithographic apparatus comprising:
a radiation source configured to produce a radiation beam and a support configured to support a patterning device, the patterning device being configured to impart the radiation beam with a pattern to form a patterned radiation beam; wherein the support is provided with a pellicle which comprises a layer of Silicene or Silicene derivative.
21. A multi-layer mirror comprising alternating layers of a first material and a second material, wherein Silicene or Silicene derivative is provided between the alternating layers.
22. A spectral purity filter comprising a grid configured to prevent or reduce the passage of infrared radiation, wherein the grid is covered with Silicene or Silicene derivative which prevents the passage of oxygen to the grid.
23. A lithographic mask comprising a patterned reflective surface or structure provided with a layer of fullerene.
24. A pellicle comprising a layer of fullerene.

25. The pellicle of clause 24, further comprising one or more layers of supporting material.

26. The pellicle of clause 24 or clause 25, wherein the pellicle further comprises a supporting structure which supports one or more layers of the pellicle.

27. A reflector comprising a reflecting surface or structure comprising a layer of fullerene.

28. The reflector of clause 27, wherein the reflector further comprises a multilayer stack.

29. A spectral purity filter comprising a layer of fullerene.

30. A spectral purity filter comprising a first filter which blocks or reduces the intensity of radiation at a first wavelength and a second filter which blocks or reduces the intensity of radiation at a second wavelength, wherein the second filter comprises a layer of fullerene.

31. The spectral purity filter of clause 29 or 30, wherein the first wavelength is an infrared wavelength and the second wavelength is a DUV wavelength.

32. An apparatus comprising one or more of: a support to hold a lithographic mask of clause 23, or the pellicle of clause 24, or the reflector of clause 27, or the spectral purity filter of clause 29 or 30.

33. A method of removing contamination from a mask which includes a layer of fullerene to which contamination particles may become attached, the method comprising using a fullerene etching substance to destroy at least some of the fullerene such that the contamination particles are released from the fullerene layer.

34. The method of clause 33, wherein the method further comprises replacing or repairing the layer of fullerene on the mask.

The invention claimed is:

1. A reflector comprising a reflecting surface or structure provided with a layer, the layer comprising a substance selected from Silicene, or a Silicene derivative, or combinations thereof.

2. The reflector according to claim 1, wherein the layer is a single layer.

3. The reflector according to claim 1, wherein the layer comprises multiple layers, and wherein at least one layer from the multiple layers comprises a substance selected from Silicene, or a Silicene derivative, or combinations thereof.

4. The reflector according to claim 1, wherein the layer is a cap layer.

5. The reflector according to claim 1, wherein the reflector is a multilayer mirror comprising alternating layers of a first material and a second material, and wherein a layer comprising a substance selected from Silicene, or a Silicene derivative, or combinations thereof, is provided between at least two of the alternating layers.

6. A reflector comprising a reflecting surface or structure comprising a substance selected from Silicene, or a Silicene derivative or combinations thereof.

7. The reflector according to claim 1, wherein the reflecting structure is a multilayer stack.

8. The reflector according to claim 1, wherein the reflecting surface is metal.

9. A method of applying a cap layer to a reflector comprising
forming a layer comprising a substance selected from Silicene, or a Silicene derivative, or combinations thereof, on a material,
pressing the layer onto a surface of the reflector,
then etching away the material such that a cap layer comprising a substance selected from Silicene, or a Silicene derivative, or combinations thereof, is formed on the reflector.

10. A lithographic mask comprising a patterned reflective surface or structure provided with a layer or a pellicle comprising a substance selected from Silicene, or a Silicene derivative, or fullerene, or a fullerene derivative, or combinations thereof.

11. A membrane for debris mitigation comprising a substance selected from Silicene, or a Silicene derivative, or fullerene, or a fullerene derivative, or combinations thereof, held by a supporting structure.

12. An apparatus comprising one or more of:
a reflector comprising a reflecting surface or structure provided with a layer, the layer comprising a substance selected from Silicene, or a Silicene derivative, or combinations thereof, or
a pellicle for a lithographic mask comprising a substance selected from Silicene, or a Silicene derivative, or fullerene, or a fullerene derivative, or combinations thereof, or
a support to hold a lithographic mask comprising a patterned reflective surface or structure provided with a layer or a pellicle comprising a substance selected from Silicene, or a Silicene derivative, or fullerene, or a fullerene derivative, or combinations thereof, or
a membrane for debris mitigation comprising a substance selected from Silicene, or a Silicene derivative, or fullerene, or a fullerene derivative, or combinations thereof, held by a supporting structure.

13. The apparatus according to claim 12, wherein the apparatus further comprises one or more of the following elements:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

* * * * *